(12) United States Patent
Micheloni et al.

(10) Patent No.: US 8,694,849 B1
(45) Date of Patent: Apr. 8, 2014

(54) SHUFFLER ERROR CORRECTION CODE SYSTEM AND METHOD

(75) Inventors: Rino Micheloni, Turate (IT); Alessia Marelli, Dalmine (IT); Peter Z. Onufryk, Flanders, NJ (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 164 days.

(21) Appl. No.: 13/330,573

(22) Filed: Dec. 19, 2011

(51) Int. Cl.
*H03M 13/00* (2006.01)

(52) U.S. Cl.
USPC .......................................... 714/753; 714/770

(58) Field of Classification Search
USPC ........................ 714/763, 770, 752, 758, 753
See application file for complete search history.

(56) References Cited

U.S. PATENT DOCUMENTS

| | | | |
|---|---|---|---|
| 815,137 A | 3/1906 | Beecher | |
| 5,732,092 A | 3/1998 | Shinohara | |
| 6,539,515 B1 | 3/2003 | Gong | |
| 6,976,197 B2 | 12/2005 | Faust et al. | |
| 7,206,992 B2 | 4/2007 | Xin | |
| 7,237,183 B2 | 6/2007 | Xin | |
| 7,937,641 B2 | 5/2011 | Amidi | |
| 7,958,430 B1 | 6/2011 | Kolokowsky et al. | |
| 7,975,193 B2 | 7/2011 | Johnson | |
| 8,176,367 B2 | 5/2012 | Dreifus et al. | |
| 8,219,894 B2 | 7/2012 | Au et al. | |
| 8,245,112 B2 | 8/2012 | Hicken et al. | |
| 8,245,117 B1 | 8/2012 | Wu | |
| 8,255,770 B2 | 8/2012 | Park et al. | |
| 8,261,136 B2 | 9/2012 | D'Abreu et al. | |
| 8,281,227 B2 * | 10/2012 | Thatcher et al. | 714/770 |
| 8,286,004 B2 | 10/2012 | Williams | |
| 8,307,258 B2 | 11/2012 | Flynn et al. | |
| 8,327,220 B2 * | 12/2012 | Borchers et al. | 714/758 |
| 8,335,977 B2 | 12/2012 | Weingarten et al. | |
| 8,402,201 B2 * | 3/2013 | Flynn et al. | 711/103 |
| 8,429,497 B2 | 4/2013 | Tu et al. | |
| 2003/0033567 A1 | 2/2003 | Tamura et al. | |
| 2004/0181735 A1 | 9/2004 | Xin | |
| 2005/0248999 A1 | 11/2005 | Tamura et al. | |
| 2007/0050688 A1 * | 3/2007 | Thayer | 714/100 |
| 2007/0089031 A1 | 4/2007 | Hufman et al. | |
| 2008/0005382 A1 * | 1/2008 | Mimatsu | 710/19 |
| 2008/0229079 A1 * | 9/2008 | Flynn et al. | 712/220 |
| 2008/0229164 A1 | 9/2008 | Tamura et al. | |

(Continued)

OTHER PUBLICATIONS

NVM Express, Revision 1.0; Intel Corporation; Mar. 1, 2011.

*Primary Examiner* — Albert Decady
*Assistant Examiner* — Osman Alshack
(74) *Attorney, Agent, or Firm* — Kenneth Glass; Stanley J. Pawlik; Glass & Associates

(57) ABSTRACT

A data storage device stores a data unit in a memory page of a storage block along with an error correction code unit for the data unit. Additionally, the data storage device stores an error correction code unit for the data unit in a memory page of another storage block. In various embodiments, one or both of the error correction code units form an error correction code for correcting data bit errors in the data unit. Because the memory page containing the data unit does not have a storage capacity for simultaneously storing the error correction code and the data unit, the data storage device is capable of correcting a greater number of data bit errors in the data unit by using the error correction code in comparison to using an error correction code that would fit in the memory page.

27 Claims, 9 Drawing Sheets

(56) References Cited

U.S. PATENT DOCUMENTS

| | | | |
|---|---|---|---|
| 2008/0256292 A1* | 10/2008 | Flynn et al. | 711/114 |
| 2009/0327802 A1 | 12/2009 | Fukutomi | |
| 2010/0199149 A1 | 8/2010 | Weingarten | |
| 2010/0211737 A1* | 8/2010 | Flynn et al. | 711/114 |
| 2010/0211852 A1 | 8/2010 | Lee et al. | |
| 2010/0293440 A1* | 11/2010 | Thatcher et al. | 714/764 |
| 2011/0055659 A1 | 3/2011 | Tu et al. | |
| 2011/0072331 A1 | 3/2011 | Sakaue et al. | |
| 2011/0246853 A1 | 10/2011 | Kim | |
| 2011/0296084 A1 | 12/2011 | Nango | |
| 2012/0054413 A1* | 3/2012 | Brandt | 711/103 |

* cited by examiner

SHUFFLER ERROR CORRECTION CODE SYSTEM AND METHOD

CROSS-REFERENCES TO RELATED APPLICATIONS

The present application is related to U.S. patent application Ser. No. 12/913,716 filed on Oct. 27, 2010 and entitled "BCH Data Correction System and Method" and U.S. patent application Ser. No. 13/023,336 filed on Feb. 8, 2011 and entitled "Nonvolatile Memory Controller with Two Stage Error Correction Technique for Enhanced Reliability", each of which is incorporated herein by reference in its entirety.

BACKGROUND

Error correction codes are often employed in a memory device for detecting and correcting data bit errors in data stored in the memory device. Generally, the number of data bit errors detectable and correctable in the data increases with an increasing number of error bits in the error correction code. In many memory devices, data is stored in a memory location of the memory device along with the error correction code for the data. In this way, the data and the error correction code may be written to the memory location in a single write memory operation and read from the memory location in a single read memory operation.

A flash storage typically has data blocks for storing data. Each of these storage blocks includes a number of memory pages identified by page number. The lowest page number of a memory page in a storage block of the flash storage is page 0, and the remaining memory pages in the storage block are identified by a sequence of higher page numbers. In this type of flash storage, data is stored in a memory page of a storage block along with the error correction code for the data.

In some types of NAND flash storage, the bit-error-rate for data stored in a storage block varies among the memory pages of the storage block. Generally, memory pages having a higher page number have a higher bit-error rate than memory pages having a lower page number. As a result of this anomaly in NAND flash storage, memory pages having higher page numbers in NAND flash storage have a higher occurrence of data bits errors than memory pages having lower page numbers in the NAND flash storage.

SUMMARY

In various embodiments, a data storage device stores a data unit in a memory page of a data storage block along with an error correction code unit for the data unit. Additionally, the data storage device stores an error correction code unit for the data unit in a memory page of an error correction code storage block. In some embodiments, the error correction code units combine to form an error correction code for the data unit, which does not fit in the memory page of the data storage block along with the data unit. In this way, the data storage device stores an error correction code for the data unit that does not fit in the memory page of the data storage block along with the data unit.

In other embodiments, each of the error correction code units is an error correction code for the data unit but the error correction code stored in the memory page of the error correction code storage block has a greater number of error bits, and thus a higher error correction capacity, than the error correction code stored in the memory page of the data storage block. Moreover, the error correction code unit having the higher error correction capacity does not fit in the memory page of the data storage block along with the data unit. The data unit has a number of data bits errors exceeding the error correction capacity of the error correction code stored in the memory page of the data storage block, the data storage device attempts to correct the data bit errors in the data unit by using the error correction code stored in the memory page of the error correction code storage block.

Because the data storage device stores an error correction code having a higher error correction capacity than an error correction code that would fit in a storage block of the data storage block along with the data unit, the data storage device is capable of correcting a greater number of data bits errors in the data unit in comparison to other data storage devices in which both data and an error correction code for the data are stored in a same memory page.

In some embodiments, the data storage device stores error correction codes having higher error correction capacities for data units stored in memory pages having higher bit-error rates than for data units stored in memory pages having lower bit-error rates. In this way, uncorrectable bit-error rates for memory pages having the higher bit error rate is reduced in comparison to other data storage devices that store error correction codes having lower error correction capacities for data.

A system, in accordance with one embodiment, includes a data storage module and a data storage controller coupled to the data storage module. The data storage module includes a first storage block and a second storage block. The first storage block includes a first memory page, and the second storage block includes a first memory page. The data storage controller is configured to store a first data unit into the first memory page of the first storage block, store a first error correction code unit for the first data unit into the first memory page of the first storage block, and store a second error correction code unit for the first data unit into the first memory page of the second storage block.

A system, in accordance with one embodiment, includes a data storage module and a data storage controller coupled to the data storage module. The data storage module includes storage blocks, which include a data storage block and an error correction code storage block. Each of the storage blocks includes memory pages having corresponding bit-error rates. The memory pages of each storage block include memory pages having a lower average bit-error rate and memory pages having a higher average bit-error rate. The data storage controller is configured to store data units and error correction codes having lower error correction capacities into the memory pages of the data storage block. The data storage controller is further configured to store error correction codes having higher error correction capacities into the memory pages of the error correction code storage block for those data units stored in the memory pages having the higher average bit-error rate in the data storage block.

A method, in accordance with one embodiment includes, storing a first data unit into a first memory page of a first storage block of a data storage device. The method further includes storing a first error correction code unit for the first data unit into the first memory page of the first storage block. Additionally, the method includes storing a second error correction code unit for the first data unit into a first memory page of a second storage block of the data storage device. The method also includes determining a number of data bit errors in the first data unit and correcting data bit errors in the first data unit based on the first error correction code unit and the second error correction code unit.

In various embodiments, at least one of the first error correction code unit and the second error correction code unit forms an error correction code that does not fit in the first memory page of the first storage block along with the first data unit. In this way, the method corrects data bit errors in the first data unit by using an error correction code that does not fit in the first memory page of the first storage block along with the first data unit.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a data storage device stores a data unit in a memory page of a storage block along with an error correction code unit for the data unit. Additionally, the data storage device stores another error correction code unit for the data unit in a memory page of another storage block. In various embodiments, one or both of the error correction code units form an error correction code for correcting data bit errors in the data unit. Because the memory page containing the data unit does not have a storage capacity for simultaneously storing the error correction code and the data unit, the data storage device is capable of correcting a greater number of data bit errors in the data unit by using the error correction code in comparison to using an error correction code that would fit in the memory page.

In some embodiments, the data storage device stores error correction codes having higher error correction capacities for data stored in memory pages having higher bit-error rates than for data stored in memory pages having lower bit-error rates. In this way, the uncorrectable bit-error rate for data stored in the memory pages having the higher bit error rate is reduced in comparison to other data storage devices that store error correction codes having lower error correction capacities for data.

Figure 1:
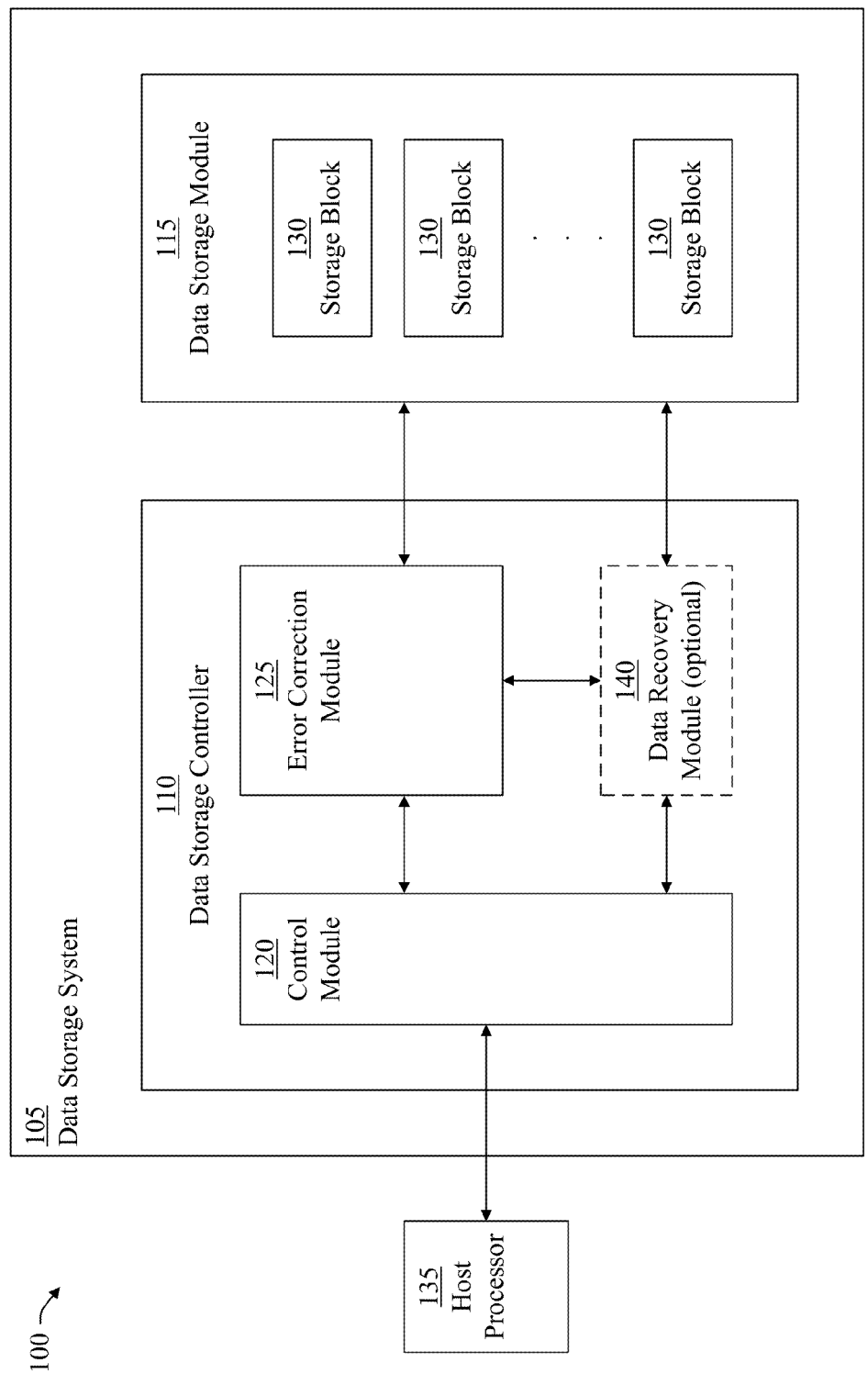
FIG. 1 is a block diagram of a data storage system, in accordance with an embodiment of the present invention.

FIG. 1 illustrates a computing system 100, in accordance with an embodiment of the present invention. The computing system 100 includes a host processor 135 and a data storage system 105 coupled (e.g., connected) to the host processor 135. The data storage system 105 includes a data storage controller 110 and a data storage module 115 coupled (e.g., connected) to the data storage controller 110. The data storage controller 110 includes a control module 120 and an error correction module 125. The error correction module 125 is coupled (e.g., connected) to the control module 120 and the data storage module 115. Moreover, the data storage module 115 includes storage blocks 130 for storing data. In some embodiments, the data storage system 105 includes an optional data recovery module 140 coupled (e.g., connected) to the control module 120, the error correction module 125, and the data storage module 115. In various embodiments, the data storage module 115 is a nonvolatile memory, such as a flash storage, and the data storage system 105 is a solid state drive (SSD).

In operation, the control module 120 receives a data write command and a data unit associated with the data write command from the host processor 135. The error correction module 125 generates one or more error correction codes (ECCs) for the data unit and writes (i.e., stores) the data unit and each error correction code for the data unit into storage blocks 130 of the data storage module 115. Each error correction code for the data unit includes redundancy information for correcting up to a predetermined number of data bit errors in the data unit.

In further operation, the control module 120 receives a data read command from the host processor 135. The error correction module 125 reads the data unit and an error correction code for the data unit from storage blocks 130 of the data storage module 115. The error correction module 125 determines based on the error correction code whether the data unit has a number of data bit errors. If the data unit does not have any data bit errors, the control module 120 provides the data unit to the host processor 135. If the error correction module 125 determines the data unit has at least one data bit error, the error correction module 125 determines whether the number of data bit errors in the data unit exceeds the error correction capacity of the error correction code. If the number of data bit errors does not exceed the error correction capacity of the error correction code, the error correction module 125 corrects the data bit errors in the data unit by using the error correction code. In turn, the control module 120 provides the corrected data unit to the host processor 135.

In some embodiments, if the number of data bit errors in the data unit exceeds the error correction capacity of the error correction code (i.e., the first error correction code), the error correction module 125 reads another error correction code (i.e., a second error correction code) for the data unit from a storage block 130 of the data storage module 115, which has a higher error correction capacity than the first error correction code. For example, the first error correction code may have an error correction capacity for correcting up to R data bit errors in the data unit and the second error correction code may have an error correction capacity for correcting up to S data bit errors in the data unit, where S is greater than R. The error correction module 125 determines a number of data bit errors in the data unit based on the second error correction code and determines whether the number of data bit errors in the data unit exceeds the error correction capacity of the second error correction code. If the number of data bit errors does not exceed the error correction capacity of the second error correction code, the error correction module 125 corrects the data bit errors in the data unit by using the second error correction code. In turn, the control module 120 provides the corrected data unit to the host processor 135.

In some embodiments, the second error correction code includes a combination of the first error correction, which includes redundancy bits for correcting up to R data bit errors in the data unit, and some additional redundancy bits for correcting additional data bit errors in the data unit. In these embodiments, the additional redundancy bits in the second error correction code enhance the error correction capability of the first error correction code so that the second error correction code has an error correction capacity for correcting S data bit errors in the data unit, where S is greater than R.

In various embodiments, the error correction module 125 stripes data units and error correction codes for the data units across storage blocks 130 of the data storage module 115. In these embodiments, the data recovery module 140 generates parity data for data units and stores the parity data in a storage block 130 of the data storage module 115. In this way, the data storage system 105 writes (i.e., stores) a data stripe, which includes the data units, the error correction codes for the data units, and the parity data for the data units, into the storage blocks 130 of the data storage module 115. In embodiments in which the error correction module 125 writes (i.e., stores) a single error correction code for a data unit among storage blocks 130 of the data storage module 115, the data recovery module 140 recovers the data unit if the number of data bit errors in the data unit exceeds the error correction capacity of the error correction code. In turn, the control module 120 provides the recovered data unit to the host processor 135. In embodiments, in which the error correction module 125 writes (i.e., stores) an error correction code having a lower error correction capacity and an error correction code having a higher error correction capacity among storage blocks 130 of the data storage module 115, the data recovery module 140 recovers the data unit if the number of data bit errors in the data unit exceeds the error correction capacity of the error correction code having the higher error correction capacity. In turn, the control module 120 provides the recovered data unit to the host processor 135.

In some embodiments, the data recovery module 140 generates the parity unit by performing a redundant array of inexpensive disks (RAID) operation on data units based on a RAID level (e.g., RAID levels 2-6). In these embodiments, the data recovery module 140 recovers a data unit of a data strip by performing a RAID operation on the other data units of the data stripe and the parity unit of the data stripe. In various embodiments, the parity unit includes one or more blocks or bits of parity data, which may be stored in a dedicated storage block 130 of the data storage module 115 or distributed among storage blocks 130 of the data storage module 115. For example, the parity unit may be distributed among the storage blocks 130 according to a RAID Level 5 algorithm.

In various embodiments, each of the control module 120, the error correction module 125, and the data recovery module 140 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like. In various embodiments, the data storage module 115 may be any type of volatile or nonvolatile memory organized into storage blocks 130. For example, the data storage module 115 may be a flash storage, such as a NAND flash storage, in which an entire storage block 130 must be erased in a process of reprogramming (i.e., modifying data) in a memory page 200 contained in the storage block 130.

In various embodiments, the data storage system 105 is implemented in an integrated circuit of an integrated circuit device which may include an integrated circuit package containing the integrated circuit. In some embodiments, the data storage system 105 is implemented in a single integrated circuit die or chip. In other embodiments, the data storage system 105 is implemented in more than one integrated circuit die or chip of an integrated circuit device which may include a multichip package containing the integrated circuit die or chips.

Figure 2:
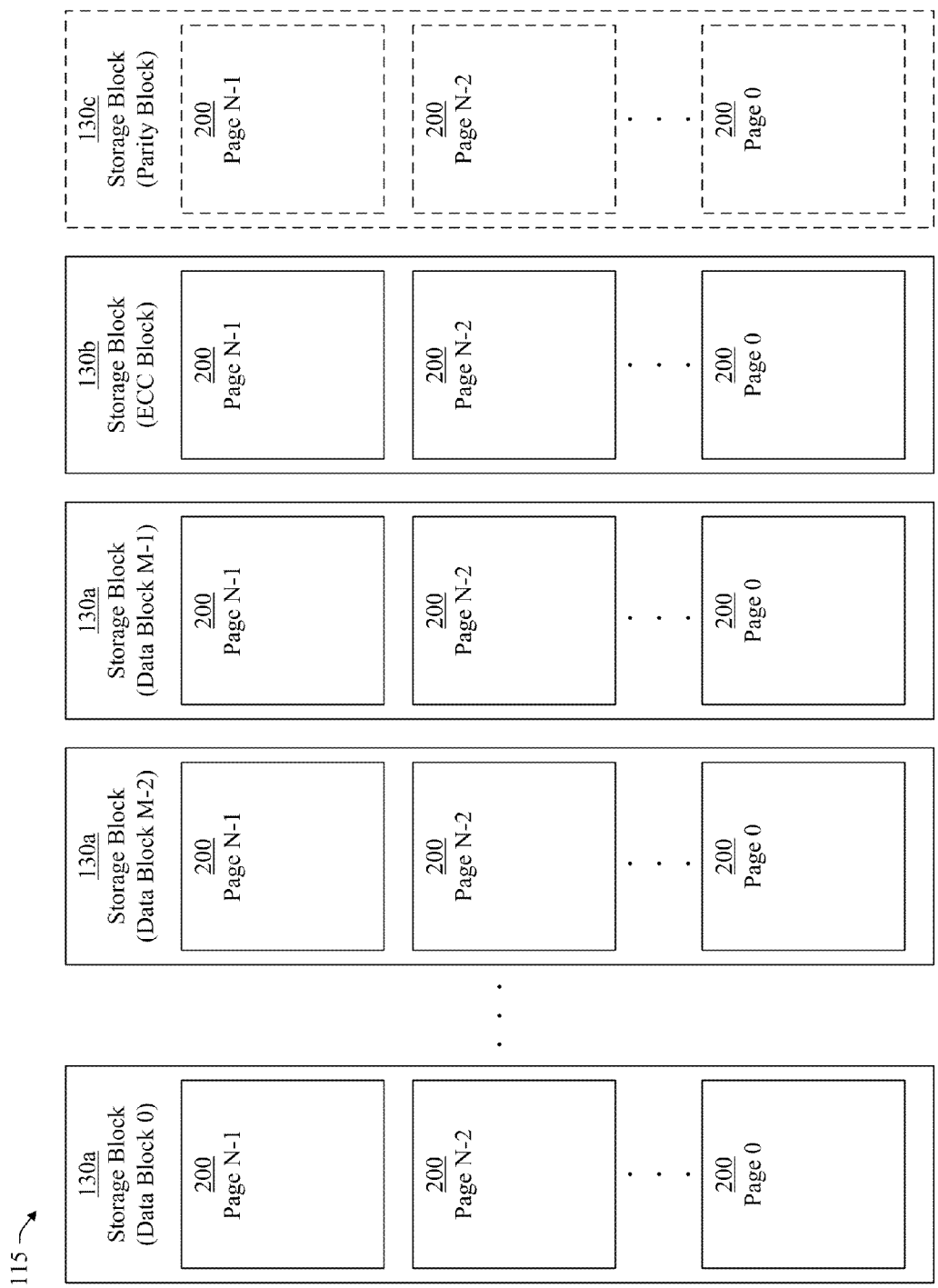
FIG. 2 is a block diagram of a data storage module, in accordance with an embodiment of the present invention.

FIG. 2 illustrates the data storage module 115, in accordance with an embodiment of the present invention. The data storage module 115 includes storage blocks 130 (i.e., storage blocks 130*a-c*), each of which includes a number of memory pages (Pages) 200. Each of the storage blocks 130 has N memory pages 200, each of which is identified by a memory page number in a sequence of memory page numbers from 0 to N−1. Moreover, each of the memory pages 200 has a bit-error rate correlated to the memory page number of the memory page 200.

As illustrated in FIG. 2, the storage blocks 130 of the data storage module 115 have various types, which include a number of data storage blocks (Data Blocks) 130*a*, an error correction code storage block (ECC Block) 130*b*, and a parity storage block (Parity Block) 130*c*. In the embodiment of FIG. 2, the data storage module 115 includes M data storage blocks 130*a*, an error correction code storage block 130*b*, and a parity storage block 130*c*. Each of the data storage blocks 130*a* is identified by a data block storage number in a sequence of data block storage numbers 0 through M−1. In various embodiments, the data storage system 105 stores a data unit and an error correction code unit for the data unit into a data storage block 130*a*, and stores another error correction code unit for the data unit, into the error correction code storage block 130*b*. In some embodiments, the error correction code unit stored in the data storage block 130*a* is an error correction code for the data unit, and the error correction code unit stored in the data storage block 130*b* is an error correction code for the data unit. In these embodiments, the error correction code stored in the data storage block 130*b* has a higher error correction capacity than the error correction code stored in the data storage block 130*a*. The data unit includes a number of data bits and each of the error correction codes includes a number of error bits for correcting data bit errors in the data unit. Moreover, the error correction code stored in the error correction code storage block 130*b* has a greater number of error bits than the error correction code stored in the data storage block 130*a*.

In other embodiments, the error correction code unit stored in the data storage block 130*a* is an error correction code for the data unit, and the combination of the error correction code unit stored in the data storage block 130*a* with the error correction code unit stored in the data storage block 130*b* is an error correction code for the data unit having a higher error correction code capacity than the error correction code stored in the data storage block 130*a*. In some embodiments, the parity storage block 130*c* is optional. Although only a single error correction code storage block 130*b* and a single parity block 130*c* are illustrated in FIG. 2, the data storage module 115 may have any number of error correction code storage blocks 130*b* and any number of parity blocks 130*c* in other embodiments.

In some embodiments, the bit-error rates of the memory pages 200 have a positive correlation with the memory page numbers of the memory pages 200 such that higher memory page numbers generally have higher bit-error rates than lower memory page numbers. In various embodiments, the correlation between the bit-error rates of the memory pages 200 and the memory page numbers of the memory pages 200 is an initial correlation existing at a time of manufacture of the data storage system 105. Moreover, the initial correlation between the bit-error rates of the memory pages 200 and the memory page numbers of the memory pages 200 is predicable based on the structure of the data storage module 115. In various embodiments, the bit-error rates of the memory pages 200 have a positive correlation with a corresponding sequence of memory page numbers identifying the memory pages 200.

In some embodiments, the error correction code units for the data unit form an error correction code for the data unit, as is described more fully herein. Moreover, the memory page 200 containing the data unit does not have a storage capacity for storing the data unit and the error correction code for the data unit, which includes both of the error correction code units. In this way, the data storage system 105 stores an error correction code for the data unit in the memory page 200 of the data storage block 130a containing one of the error correction code units and the memory page 200 of the error correction code storage block 130b containing the other error correction code unit for the data unit.

In some embodiments, the error correction code unit stored in the memory page 200 of the data storage block 130a is an error correction code for the data unit, and the error correction code unit stored in the memory page 200 of the data storage block 130b includes additional redundancy bits for enhancing the error correction capacity of the error correction code. In these embodiments, the combination of the error correction code units stored in the memory pages 200 of the data storage blocks 130a and 130b forms an error correction code for the data unit that has a higher error correction capacity than the error correction code stored in the memory page 200 of the data storage block 130a.

In various embodiments, the error correction module 125 reads the data unit and both error correction code units for the data unit from the data storage module 115 in a single read operation. In this way, the error correction module 125 reads the data unit and the error correction code units for the data unit substantially simultaneously. If the data unit has a number of data bit errors not exceeding the error correction capacity of the error correction code (i.e., the error correction code units), the error correction module 125 corrects the data bit errors in the data unit by using the error correction code. Because the error correction code includes a number of error bits greater than a number of error bits that can be stored in the memory page 200 of the data storage block 130a containing the data unit, the error correction code has a greater error correction capacity than an error correction code that could be stored in the memory page 200 of the data storage block 130a along with the data unit. In this way, the data storage system 105 is capable of correcting a greater number of data bit errors in the data unit in comparison to other data storage systems that store both a data unit and an error correction code for the data unit in a same memory page of a storage block.

In others embodiments, each of the error correction code units for the data unit form an error correction code for the data unit but the error correction code stored in the memory page 200 of the data storage block 130b has a higher error correction capacity than the error correction code stored in the memory page 200 of the data storage block 130a. Moreover, the memory page 200 of the data storage block 130a containing the data unit does not have a storage capacity for storing both the data unit and the error correction code unit stored in the memory page 200 of the error correction code storage block 130b because the error correction code unit stored in the memory page 200 of the error correction code storage block 130b has a greater number of error bits than the error correction code unit stored in the memory page 200 of the data storage block 130a containing the data unit.

In various embodiments, the error correction module 125 reads the data unit and the error correction code unit for the data unit from the memory page 200 of the data storage module 115 in a single read operation. In this way, the error correction module 125 reads the data unit and the error correction code for the data unit having the lower error correction capacity substantially simultaneously from the memory page 200 of the data storage block 120. If the number of data bit errors in the data unit does not exceed the error correction capacity of the error correction code having the lower error correction capacity, the error correction module 125 corrects the data bit errors in the data unit by using the error correction code.

Otherwise, if the data unit read from the memory page 200 of the data storage module 115 exceeds the error correction capacity of the error correction code having a lower error correction capacity, the error correction module 125 reads the error correction code unit from the memory page 200 of the error correction code storage block 130b. In this way, the error correction module 125 reads the error correction code unit having the higher error correction capacity from the memory page 200 of the error correction code storage block 130b. If the number of data bit errors in the data unit does not exceed the error correction capacity of the error correction code having the higher error correction capacity, the error correction module 125 corrects the data bit errors in the data unit by using the error correction code. In this way, the data storage system 105 is capable of correcting a greater number of data bit errors in the data unit in comparison to other data storage systems that store both a data unit and an error correction code for the data unit in a same memory page of a storage block.

In other embodiments, if the data unit read from the memory page 200 of the data storage module 115 exceeds the error correction capacity of the error correction code having a lower error correction capacity, the error correction module 125 reads the error correction code unit from the memory page 200 of the error correction code storage block 130b. In this way, the error correction module 125 reads additional redundancy bits for enhancing the error correction capacity of the error correction code having the lower error correction capacity. Moreover, the error correction code stored in the memory page 200 of the data storage block 130a in combination with the additional redundancy bits forms an error correction code having a higher error correction capacity than the error correction code having the lower error correction capacity. If the number of data bit errors in the data unit does not exceed the error correction capacity of the error correction code having the higher error correction capacity, the error correction module 125 corrects the data bit errors in the data unit by using the error correction code having the higher error correction capacity In this way, the data storage system 105 is capable of correcting a greater number of data bit errors in the data unit in comparison to other data storage systems that store both a data unit and an error correction code for the data unit in a same memory page of a storage block.

In various embodiments, each memory page 200 of a storage block 130 is divided into a data area and a spare area. In these embodiments, the data storage system 105 stores data units in the data areas of the memory pages 200 and stores error correction code units for the data units in the spare areas of the memory pages 200. In some embodiments, the data storage system 105 stores the other error correction code units (e.g., error correction codes having higher error correction capacities or additional redundancy bits) for the data units in the data areas of the memory pages 200 in the error correction code storage block 130b. In other embodiments, the data storage system 105 stores the other error correction code units for the data units (e.g., error correction codes having higher error correction capacities) in both the data areas and the spare areas of the memory pages 200 in the error correction code storage block 130b.

Figure 3:
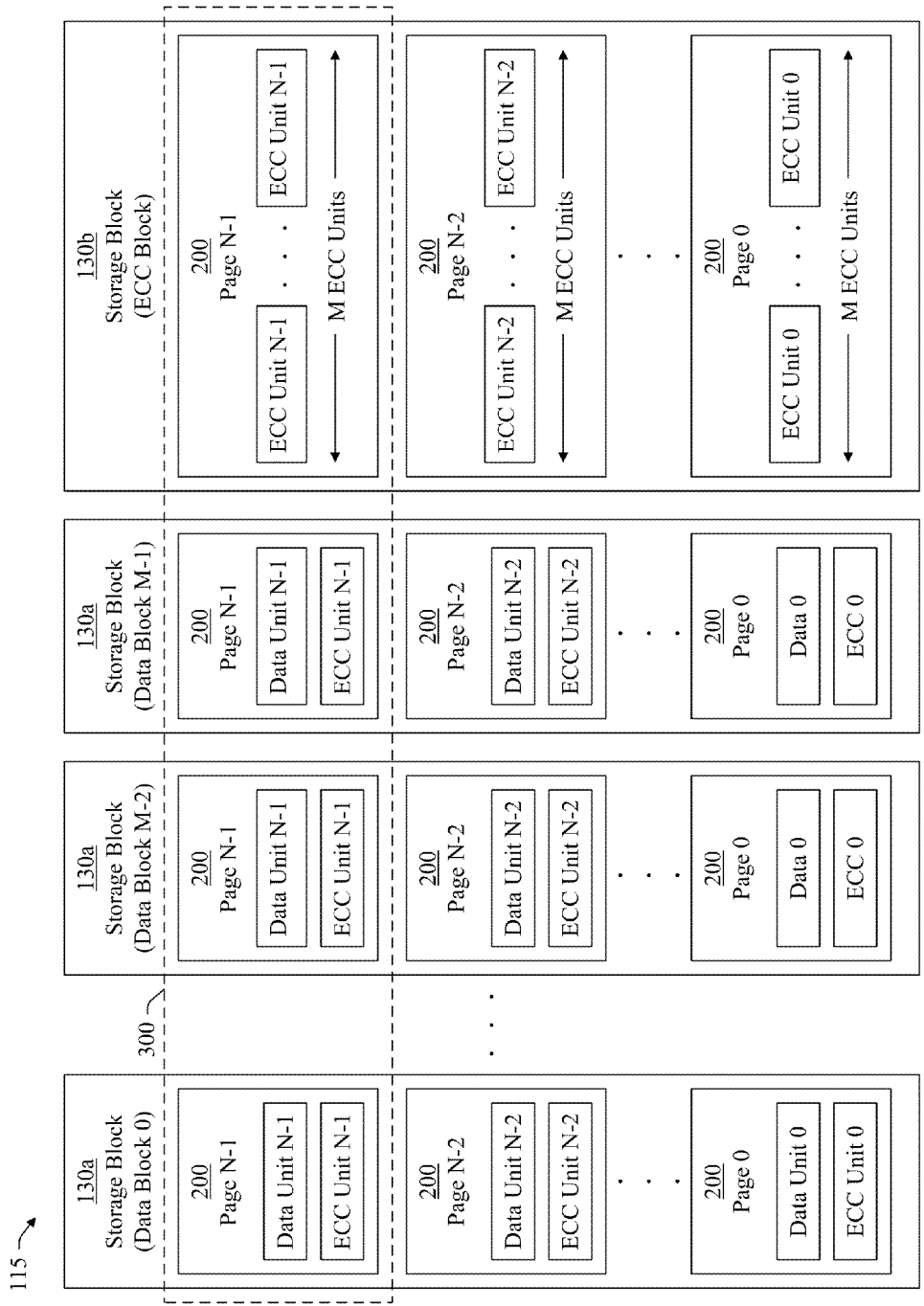
FIG. 3 is a block diagram of a data storage module, in accordance with an embodiment of the present invention.

FIG. 3 illustrates the data storage module 115, in accordance with an embodiment of the present invention. The data storage module 115 includes a number of storage blocks 130, which includes M data storage blocks (Data Blocks) 130, and an error correction code storage block (ECC Block) 130. Each of the data storage blocks 130 is identified by a data block storage number in a sequence of data block storage numbers from 0 through M−1. Each of the storage blocks 130 has N memory pages 200 identified by a memory page number in a sequence of memory page numbers from 0 through N−1. Moreover, each of the memory pages 200 has a bit-error rate correlated to the memory page number of the memory page 200. Although only a single error correction code storage block 130b is illustrated in FIG. 3, the data storage module 115 may have any number of error correction code storage blocks 130 in other embodiments.

As illustrated in FIG. 3, each of the memory pages 200 in a data storage block 130a has a storage capacity for storing a data unit (e.g., Data Unit 0, Data Unit N−2, or Data Unit N−1) and an error correction code (e.g., ECC Unit 0, ECC Unit N−2, or ECC Unit N−1) for the data unit. Each of the memory pages 200 in the error correction code storage block 130b has an error correction capacity for storing a number of error correction code units equal to the number of data storage blocks 130 (i.e., M error correction code units). Moreover, a memory page 200 of the error correction code storage block 130b is capable of storing an error correction code unit (e.g., an error correction code or part of an error correction code) for each data unit stored in memory pages 200 of the data storage blocks 130 having the same memory page number as the memory page 200 of the error correction code storage block 130b. In this way, the data units and error correction code units for the data units have a homogeneous organization 300 in the data storage module 115.

In operation, a memory page 200 of the error correction code storage block 130b having a given memory page number stores an error correction code unit (e.g., an error correction code or part of an error correction code) for each of the data units stored in memory pages 200 of the data storage blocks 130 having the same memory page number. As illustrated in FIG. 3, the memory page 200 having memory page number N−1 in the error correction code storage block 130b stores an error correction code unit for each of the data units stored in the memory pages 200 having memory page number N−1 in the data storage blocks 130.

As illustrated in FIG. 3, the data storage controller 110 stores a first error correction code unit for a data unit in a memory page 200 of a data storage block 130 having a given memory page number and stores a second error correction code unit for the data unit in a memory page 200 of an error correction code storage block 130b having the same memory page number. In other embodiments, the data storage controller 110 stores the second error correction code unit of the data unit in a memory page 200 of the error correction code storage block 130b having an arbitrary memory page number. In these embodiments, the data storage controller 110 maintains a mapping between the memory page 200 containing the first error correction code unit for the data unit and the memory page 200 containing the second error correction code unit for the data unit.

Figure 4:
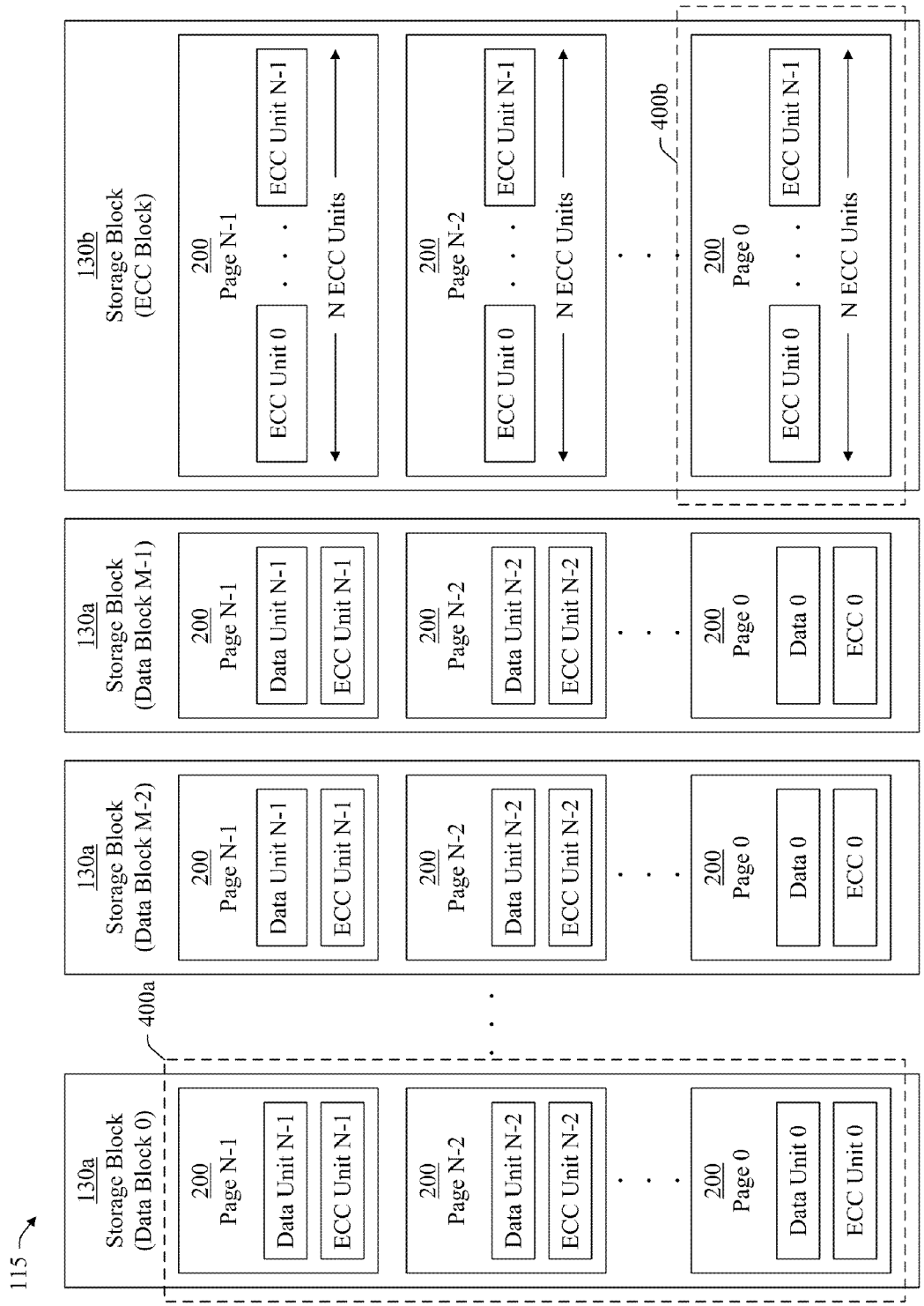
FIG. 4 is a block diagram of a data storage module, in accordance with an embodiment of the present invention.

FIG. 4 illustrates the data storage module 115, in accordance with an embodiment of the present invention. The data storage module 115 includes a number of storage blocks 130, which includes M data storage blocks (Data Blocks) 130 and an error correction code storage block (ECC Block) 130. Each of the data storage blocks 130 is identified by a data storage block number in a sequence of data storage block numbers from 0 through M−1. Each of the storage blocks 130 has N memory pages 200 identified by a memory page number in a sequence of memory page numbers from 0 to N−1. Although only a single error correction code storage block 130b is illustrated in FIG. 4, the data storage module 115 may have any number of error correction code storage blocks 130 in other embodiments. In various embodiments, each of the memory pages 200 has a bit-error rate correlated to the memory page number of the memory page 200.

As illustrated in FIG. 4, each of the memory pages 200 in a data storage block 130a has a storage capacity for storing a data unit (e.g., Data Unit 0, Data Unit N−2, or Data Unit N−1) and an error correction code (e.g., ECC Unit 0, ECC Unit N−2, or ECC Unit N−1) for the data unit. Each of the memory pages 200 in the error correction code storage block 130b has an error correction capacity for storing a number of error correction code units equal to the number of memory pages 200 in a data storage block 130a (i.e., N error correction code units). Moreover, a memory page 200 of the error correction code storage block 130b is capable of storing an error correction code unit for each of the data units stored in the memory pages 200 of a data storage block 130a. In this way, the data units and error correction code units for the data units have a heterogeneous organization 400a-b in the data storage module 115.

In operation, a memory page 200 of the error correction code storage block 130b having a given memory page number stores an error correction code unit for each of the data units stored in the memory pages 200 of a data storage block 130a. As illustrated in FIG. 4, the memory page 200 identified by memory page number 0 (i.e., Page 0) in the error correction code storage block 130b stores an error correction code unit for each of the data units stored in the memory pages 200 of the data storage block 130a identified by data storage block number 0 (i.e., Data Block 0). In this way, the memory page 200 of the error correction code storage block 130b stores up to N error correction codes units, one for each data unit stored in a memory page 200 of the data storage block 130a (e.g., Data Block 0).

Figure 5:
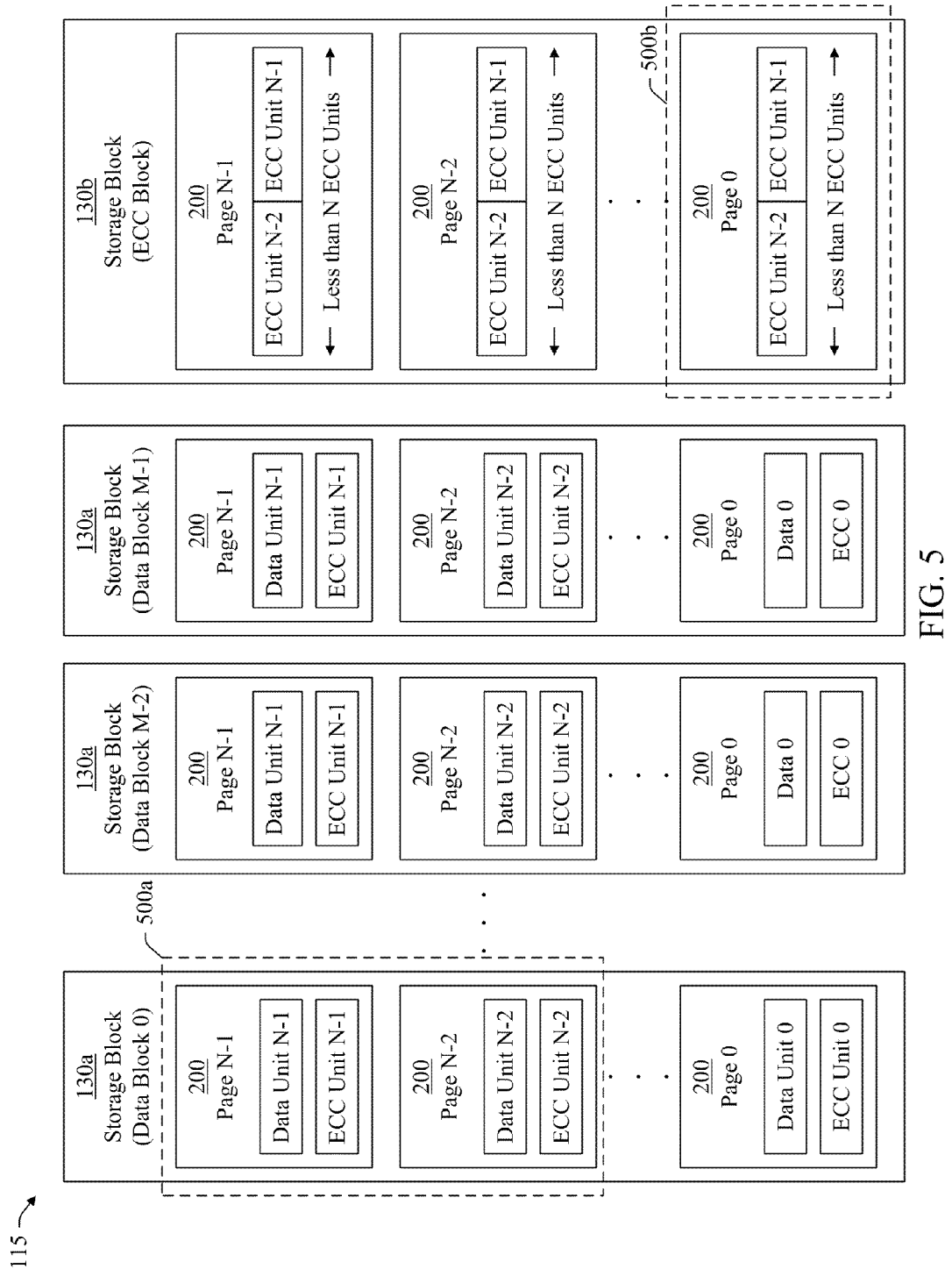
FIG. 5 is a block diagram of a data storage module, in accordance with an embodiment of the present invention.

FIG. 5 illustrates the data storage module 115, in accordance with an embodiment of the present invention. The data storage module 115 includes a number of storage blocks 130, which includes M data storage blocks (Data Blocks) 130 and an error correction code storage block (ECC Block) 130. Each of the data storage blocks 130 is identified by a data storage block number in a sequence of data storage block numbers from 0 through M−1. Each of the storage blocks 130 has N memory pages 200 identified by a memory page number in a sequence of memory page numbers from 0 to N−1. Moreover, each of the memory pages 200 has a bit-error rate correlated to the memory page number of the memory page 200. Although only a single error correction code storage block 130b is illustrated in FIG. 5, the data storage module 115 may have any number of error correction code storage blocks 130 in other embodiments. In various embodiments, each of the memory pages 200 has a bit-error rate correlated to the memory page number of the memory page 200.

As illustrated in FIG. 5, each of the memory pages 200 in a data storage block 130a has a storage capacity for storing a data unit (e.g., Data Unit 0, Data Unit N−2, or Data Unit N−1) and an error correction code (e.g., ECC Unit 0, ECC Unit N−2, or ECC Unit N−1) for the data unit. Each of the memory pages 200 in the error correction code storage block 130b has an error correction capacity for storing a number of error correction code units less than the number of memory pages 200 in a data storage block 130a (i.e., less than N error correction code units). Moreover, a memory page 200 of the error correction code storage block 130b is capable of storing an error correction code unit for some but not all of the data units stored in memory pages 200 of a data storage block 130a. In this way, the data units and error correction code units for the data units have a heterogeneous organization 500a-b in the data storage module 115.

In operation, a memory page 200 of the error correction code storage block 130b having a given memory page number stores an error correction code unit for each of the data units stored in a number of memory pages 200 of a data storage block 130a having a higher bit error rate than other memory pages 200 of the data storage block 130a. As illustrated in FIG. 5, the memory page 200 having memory page number 0 (i.e., Page 0) in the error correction code storage block 130b stores an error correction code unit for the data units stored in the memory pages 200 identified by memory page numbers N−2 and N−1 (i.e., Page N−2 and Page N−1) of the data storage block 130a identified by data storage block number 0 (i.e., Data Block 0). In this way, the memory page 200 of the error correction code storage block 130b stores less than N error correction codes, one for each data unit stored in a memory page 200 of the data storage block 130a (e.g., Data Block 0) having the higher bit error rate.

In another embodiment, the memory page 200 having memory page number N−1 (i.e., Page N−1) in the error correction code storage block 130b stores an error correction code unit for each of the data units stored in the memory pages 200 identified by memory page numbers 0 and 1 (i.e., Page 0 and Page 1) of the data storage block 130a identified by data storage block number 0 (i.e., Data Block 0). In this way, the memory page 200 of the error correction code storage block 130b stores less than N error correction codes, one for each data unit stored in a memory page 200 of the data storage block 130a (e.g., Data Block 0) having the lower bit error rate.

In various embodiments, the memory pages 200 of each storage block 130 include memory pages 200 having a lower bit-error rate (e.g., a lower average bit-error rate) and memory pages having a higher bit-error rate (e.g., a higher average bit-error rate). Moreover, the memory page numbers of the memory pages 200 in the storage blocks 130 have a correlation with the bit-error rates of the memory pages 200, for example a positive correlation. The memory pages 200 are divided into memory pages 200 having lower memory page numbers and memory pages 200 having higher memory page numbers. In some embodiments, the memory pages 200 having the higher memory page numbers have a higher bit-error rate, and the memory pages 200 having the lower memory page numbers have a lower bit-error rate. In operation, the data storage controller 110 stores data units and error correction codes for the data units having lower error correction capacities into the memory pages 200 of the data storage block 130a. Additionally, the data storage controller 110 stores error correction codes for the data units having higher error correction capacities into the memory pages 200 of the error correction code storage block 130b for those data units stored in the memory pages 200 of the data storage block 130a having the higher bit-error rate but not for those data units stored in the memory pages 200 of the data storage block 130a having the lower bit-error rate.

Figure 6:
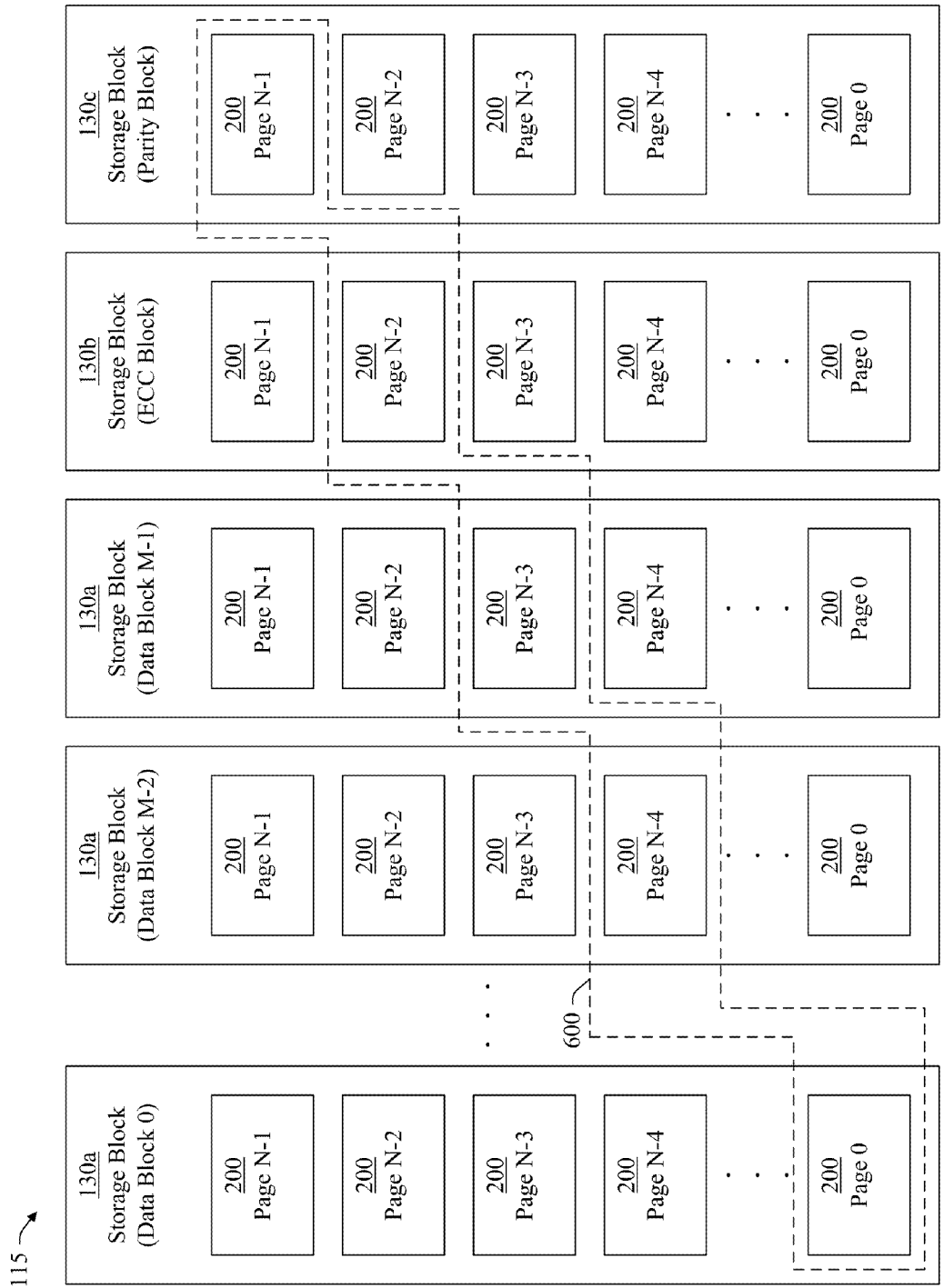
FIG. 6 is a block diagram of a data storage module, in accordance with an embodiment of the present invention.

FIG. 6 illustrates the data storage module 115, in accordance with an embodiment of the present invention. The data storage module 115 includes a number of storage blocks 130, which includes M data storage blocks (Data Blocks) 130, an error correction code storage block (ECC Block) 130, and an optional parity storage block (Parity Block) 130. Each of the data storage blocks 130 is identified by a data storage block number in a sequence of data storage block numbers from 0 through M−1. Each of the storage blocks 130 has N memory pages 200 identified by a memory page number in a sequence of memory page numbers from Page 0 to Page N−1. Moreover, each of the memory pages 200 has a bit-error rate correlated to the memory page number of the memory page 200. Although only a single error correction code storage block 130b and a single parity storage block 130c are illustrated in FIG. 6, the data storage module 115 may have any number of error correction code storage blocks 130 and any number of parity storage blocks 130 in other embodiments. In various embodiments, each of the memory pages 200 has a bit-error rate correlated to the memory page number of the memory page 200.

The error correction module 125 writes (i.e., stores) a data stripe 600, which includes a data unit, error correction code units for the data unit, and an optional parity data unit, into the data storage module 115. In this way, the error correction module 125 writes the data stripe 600 into memory pages 200 of the storage blocks 130 by storing a portion of the data stripe 600 into a memory page 200 of each storage block 130 such that each of those memory pages 200 has a unique memory page number. In various embodiments, the memory pages 200 containing the data stripe 600 have various respective bit-error rates as well as an average bit-error rate that is less than the highest bit-error rate of those memory pages 200. Because the memory pages 200 containing the data stripe 600 have an average bit-error rate that is less than the memory page 200 having the highest bit-error rate, the data storage system 105 performs fewer data recovery operations for a data unit in the data strip 600 in comparison to data storage systems that store a data stripe in memory pages having the highest bit-error rates (i.e., memory pages having a highest memory page number). In this way, reliability of the data storage system 105 is increased in comparison to data storage systems that store a data stripe into memory pages having the same memory page number.

In various embodiments, the data storage system 105 uses an error correction technique to correct data bit errors in a data unit based on the error correction code for the data unit having an lower error correction capacity and uses another error correction technique to correct data bit errors in the data unit based on the error correction code for the data unit having the higher error correction capacity. In this way, the data storage system 105 uses different error correction techniques on the data unit based on the respective error correction codes for the data unit. For example, the data storage system 105 may use a Hamming code error correction technique to correct data bit errors in a data unit based on one of the error correction codes for the data unit and use a Bose-Chaudhuri-Hochquenghem (BCH) error correction code technique to correct data bit errors in the data unit based on the other error correction code for the data unit.

In some embodiments, the parity storage block 130c is optional. In embodiments without the parity storage block 130c, the data stripe 600 does not include any memory page 200 in the parity storage block 130c. Furthermore, the memory pages 200 of the data storage blocks 130a or the error correction code storage blocks 130b, or both, store parity data units for a data stripe 600. In some embodiments, the error correction code block 130b is optional. In embodiments without the error correction code storage block 130b, the data stripe 600 does not include any memory page 200 in the error correction code storage block 130b. In some embodiments, a storage block 130 (e.g., a data storage block 130a) includes some memory pages that store data units, other memory pages that store error correction code units, and still other memory pages that store parity data units.

In some embodiments, the data storage controller 110 selects the size of the data stripes 600 as well as the memory pages 200 in the data stripe 600. For example, the data storage controller 110 may select memory pages 200 in a diagonal configuration as illustrated in FIG. 6, a horizontal configuration in which each memory page 200 of the data stripe 600 has the same memory page number, or a vertical configuration in which each memory page 200 of the data stripe 600 has a unique memory page number and is in the same storage block 130. In some embodiments, a memory page 200 of a storage block 130 may include one or more data units, one or more error correction code units for one or more data units, or one or more parity data units, or some combination thereof.

Figure 7:
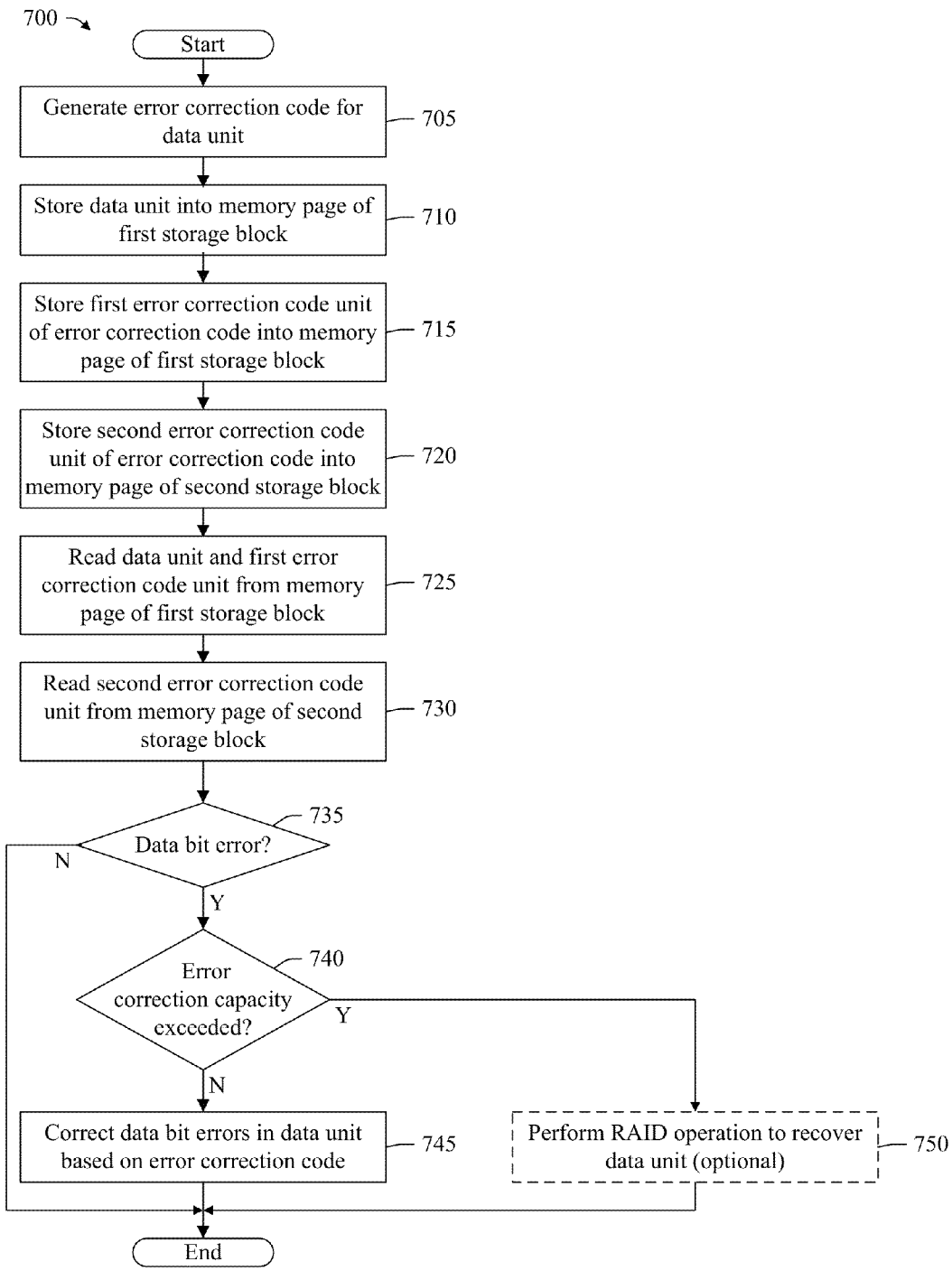
FIG. 7 is a flow chart for a method of correcting data bit errors in a data unit, in accordance with an embodiment of the present invention.

FIG. 7 illustrates a method 700 of correcting data errors in a data unit, in accordance with an embodiment of the present invention. In step 705, an error correction code is generated for a data unit. In various embodiments, the data storage controller 110 generates the error correction code for the data unit based on the data unit. The method 700 then proceeds to step 710.

In step 710, a data unit is stored into a memory page of a first storage block. In various embodiments, the data storage controller 110 stores the data unit into a memory page 200 of a storage block 130 (i.e., a first storage block 130) in the data storage module 115 of the data storage system 105. For example, the error correction module 125 may store the data unit into the memory page 200 of the storage block 130. The method 700 then proceeds to step 715.

In step 715, a first error correction code unit of the error correction code is stored into a memory page of the first storage block. In various embodiments, the data storage controller 110 stores the first error correction code unit of the error correction code into the memory page 200 of the storage block 130 containing the data unit (i.e., the first storage block 130). For example, the error correction module 125 may store the first error correction code unit for the data unit into the memory page 200 containing the data unit in a data storage block 130a. The method 700 then proceeds to step 720.

In step 720, a second error correction code unit of the error correction code is stored into a memory page of a second storage block. In various embodiments, the data storage controller 110 stores the second error correction code unit of the error correction code into a memory page 200 of another storage block 130 (i.e., a second storage block 130) in the data storage module 115 that is distinct from the storage block 130 containing the data unit (i.e., the first storage block 130). For example, the error correction module 125 may store the second error correction code unit for the data unit into the memory page 200 of an error correction code storage block 130b. In some embodiments, the first error correction code unit for the data unit is an error correction code having a lower error correction capacity for the data unit. In these embodiments, the second error correction code for the data unit includes redundancy bits for enhancing the error correction capacity of the first error correction code. Moreover, the first error correction code unit in combination with the second error correction code unit from an error correction code having a higher error correction capacity for the data unit than the error correction code having the lower error correction capacity. The method 700 then proceeds to step 725.

In step 725, the data unit and the first error correction code unit are read from the memory page of the first storage block. In various embodiments, the data storage controller 110 reads the data unit and the first error correction code unit for the data unit from the memory page 200 of the first storage block 130 (i.e., a data storage block 130a). For example, the error correction module 125 may read the data unit and the first error correction code unit for the data unit from the memory page 200 of the first storage block 130 by performing a read operation. In this way, the error correction module 125 reads both the data unit and the first error correction code unit from the memory page 200 of the first storage block 130 substantially simultaneously. In some embodiments, the first error correction code unit is an error correction code having a lower error correction capacity, and the combination of the first error correction code unit and the second error correction code unit forms an error correction code having a higher error correction capacity. In these embodiments, the error correction module 125 attempts to correct any data bit errors in the data unit not exceeding the lower error correction capacity based on the first error correction code in step 725. The method 700 then proceeds to step 730.

In step 730, the second error correction code unit is read from the memory page of the second storage block. In various embodiments, the data storage controller 110 reads the second error correction code unit for the data unit from the memory page 200 of the second storage block 130 (i.e., an error correction code storage block 130b). For example, the error correction module 125 may read the second error correction code unit for the data unit from the memory page 200 of the second storage block 130 by performing a read operation. In some embodiments the first error correction code unit is a first error correction code having a lower error correction capacity. In these embodiments, the data storage controller 110 reads the second error correction code unit from the second storage block 130b and combines it with the first error correction code to from a second error correction code having a higher error correction capacity than the first error correction code.

In some embodiments, the data storage controller 110 performs steps 725 and 730 of the method 700 substantially simultaneously. For example, the error correction module 125 may read the data unit, the first error correction code unit, and the second error correction code unit from the data storage module 115 by performing a read operation. In this way, the error correction module 125 reads the data unit, the first error correction code unit, and the second error correction code unit from the data storage module 115 substantially simultaneously. The method 700 then proceeds to step 735.

In step 735, a determination is made as to whether the data unit has a data bit error. In various embodiments, the error correction module 125 determines whether the data unit has a data bit error based on an error correction code for the data unit. In these embodiments, the first error correction code unit and the second error correction code unit form the error correction code for the data unit. If the data unit has a data bit error, the method 700 proceeds to step 740. Otherwise, the method 700 ends.

In step 740, arrived at from the determination in step 735 that the data unit has a data bit error, a determination is made as to whether the number of data bit errors in the data unit exceeds an error correction capacity of the error correction code for the data unit. In various embodiments, the error correction module 125 determines the number of data bit errors in the data unit based on the error correction code unit of the data unit. Further, the error correction code module 125 determined whether the number of data bit errors in the data unit exceeds the error correction capacity of the error correction code for the data unit. If the number of data bit errors in the data unit does not exceed the error correction capacity of the error correction code for the data unit, the method 700 proceeds to step 745. Otherwise, the method 700 proceeds to step 750.

In step 745, arrived at from the determination in step 740 that the number of data bit errors in the data unit does not exceed the error correction capacity of the error correction code for the data unit, a number of data bit errors are corrected in the data unit by using the error correction code of the data unit. In various embodiments, the error correction module 125 corrects the number of data bit errors in the data unit based on the error correction code of the data unit. For example, the error correction module 125 may correct the number of data bit errors in the data unit by using the error correction code of the data unit. The method 700 then ends.

In step 750, arrived at from the determination in step 740 that the number of data bit errors in the data unit exceeds the error correction capacity of the error correction code for the data unit, a RAID operation is performed to recover the data unit. In various embodiments, the data storage controller 110 recovers the data unit by performing a RAID operation. For example, the data recovery module 140 may recover the data unit by performing a RAID operation using a parity unit associated with the data unit. The method 700 then ends.

In various embodiments, the method 700 illustrated in FIG. 7 may include more or fewer than the steps 705-750 illustrated in FIG. 7 and described above. In some embodiments, the steps 705-750 of the method 700 illustrated in FIG. 7 may be performed in a different order than the order illustrated in FIG. 7 and described above. In some embodiments, some of the steps 705-750 of the method 700 illustrated in FIG. 7 may be performed in parallel or substantially simultaneously. In various embodiments, one or more of the steps 705-750 may be performed more than once in the method 700 illustrated in FIG. 7.

Figure 8:
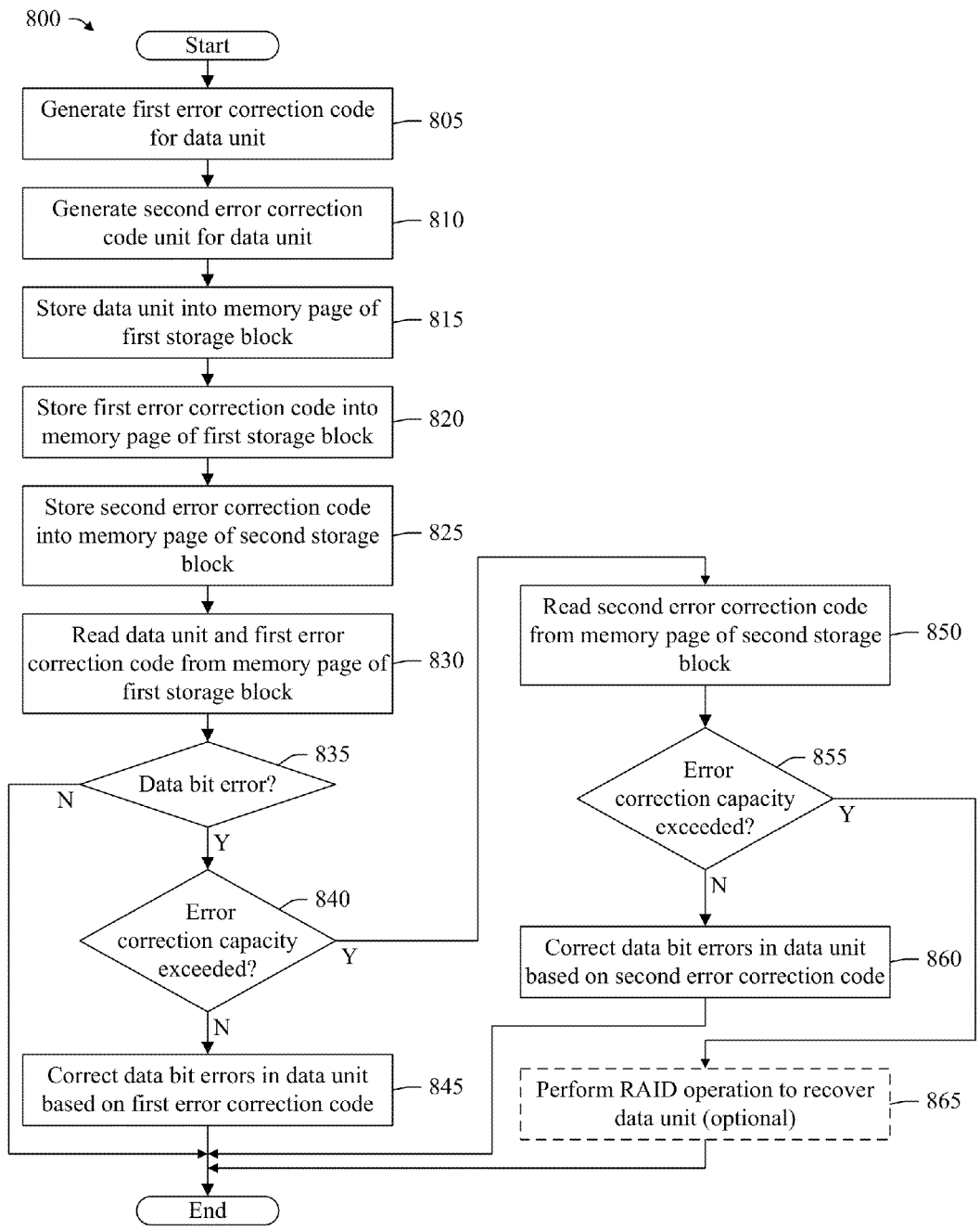
FIG. 8 is a flow chart for a method of correcting data bit errors in a data unit, in accordance with an embodiment of the present invention.

FIG. 8 illustrates a method 800 of correcting data errors in a data unit, in accordance with an embodiment of the present invention. In step 805, a first error correction code is generated for a data unit. In various embodiments, the data storage controller 110 generates the first error correction code for the data unit by generating a first error correction code unit for the data unit. For example, the error correction module 125 may generate the first error correction code for the data unit based on the data unit. The method 800 then proceeds to step 810.

In step 810, a second error correction code is generated for a data unit. In various embodiments, the data storage controller 110 generates the second error correction code for the data unit by generating a second error correction code unit for the data unit. For example, the error correction module 125 may generate the second error correction code for the data unit based on the data unit. Moreover, the second error correction code is independent and distinct from the first error correction code in that each of the error corrections codes has a respective error correction capacity for correcting a respective number of data bits in the data unit.

In other embodiments, the second error correction code is a superset of the first error correction code. For example, the first error correction code may have an error correction capacity for correcting up to R data bit errors, and the second error correction code may have an error correction capacity for correcting up to S-R data bit errors. Moreover, the second error correction code in combination with the first error correction code to forms an error correction code having an error correction capacity of S bits. In this way, the second error correction code enhanced the error correction capacity of the first error correction code. The method 800 then proceeds to step 815.

In step 815, a data unit is stored into a memory page of a first storage block. In various embodiments, the data storage controller 110 stores the data unit into a memory page 200 of a storage block 130 (i.e., the first storage block 130) in the data storage module 115 of the data storage system 105. For example, the error correction module 125 may store the data unit into the memory page 200 of a data storage block 130*a*. The method 800 then proceeds to step 820.

In step 820, the first error correction code is stored into the memory page of the first storage block. In various embodiments, the data storage controller 110 stores the first error correction code of the data unit into the memory page 200 of the first storage block 130 containing the data unit by storing the first error correction code unit into the memory page 200. For example, the error correction module 125 may store the first error correction code unit of the data unit into the memory page 200 of a data storage block 130*a* containing the data unit. The method 800 then proceeds to step 825.

In step 825, the second error correction code is stored into a memory page of a second storage block. The second error correction code has a higher error correction capacity than the first error correction code for the data unit, which has a lower error correction capacity. In various embodiments, the data storage controller 110 stores the second error correction code of the data unit into a memory page 200 of a storage block 130 (i.e., a second storage block 130) in the data storage module 115 that is distinct from the storage block 130 containing the data unit (i.e., the first storage block 130). For example, the error correction module 125 may store the second error correction code of the data unit into the memory page 200 of an error correction code storage block 130*b* by storing the second error correction code unit into the memory page 200. The method 800 then proceeds to step 830.

In step 830, the data unit and the first error correction code are read from the memory page of the first storage block. In various embodiments, the data storage controller 110 reads the data unit and the first error correction code for the first data unit from the memory page 200 of the first storage block 130. For example, the error correction module 125 may read the data unit and the first error correction code unit for the data unit from the memory page 200 of the first storage block 130 by performing a read operation. In this way, the error correction module 125 reads both the data unit and the first error correction code from the memory page 200 of the first storage block 130 substantially simultaneously. The method 800 then proceeds to step 835.

In step 835, a determination is made as to whether the data unit has a data bit error. In various embodiments, the error correction module 125 determines whether the data unit has a data bit error based on the first error correction code (i.e., the first error correction code unit) for the data unit. If the data unit has a data bit error, the method 800 proceeds to step 840. Otherwise, the method 800 ends.

In step 840, arrived at from the determination in step 835 that the data unit has a data bit error, a determination is made as to whether the number of data bit errors in the data unit exceeds an error correction capacity of the first error correction code for the data unit. In various embodiments, the error correction module 125 determines the number of data bit errors in the data unit based on the first error correction code (i.e., the first error correction code unit) of the data unit. If the number of data bit errors in the data unit does not exceed the error correction capacity of the first error correction code for the data unit, the method 800 proceeds to step 845. Otherwise, the method 800 proceeds to step 850.

In step 845, arrived at from the determination in step 840 that the number of data bit errors in the data unit does not exceed the error correction capacity of the first error correction code for the data unit, a number of data bit errors are corrected in the data unit based on the first error correction code. In various embodiments, the error correction module 125 corrects the number of data bit errors in the data unit based on the first error correction code of the data unit. For example, the error correction module 125 may correct the number of data bit errors in the data unit by using the first error correction code of the data unit. The method 800 then ends.

In step 850, arrived at from the determination in step 840 that the number of data bit errors in the data unit exceeds the error correction capacity of the first error correction code of the data unit, the second error correction code is read from the memory page of the second storage block. In various embodiments, the data storage controller 110 reads the second error correction code from the memory page 200 of the second storage block 130. For example, the error correction module 125 may read the second error correction code unit for the data unit from the memory page 200 of the second storage block 130 by performing a read operation.

In some embodiments, the data storage controller 110 performs steps 830 and 850 of the method 800 substantially simultaneously. For example, the error correction module 125 may read the data unit, the first error correction code unit, and the second error correction code unit from the data storage module 115 by performing a read operation. In this way, the error correction module 125 reads the data unit, the first error correction code, and the second error correction code from the data storage module 115 substantially simultaneously. The method 800 then proceeds to step 855.

In step 855, arrived at from step 850 in which the second error correction code is read from the memory page of the second storage block, a determination is made as to whether the number of data bit errors in the data unit exceeds an error correction capacity of the second error correction code for the data unit. In various embodiments, the error correction module 125 determines the number of data bit errors in the data unit based on the second error correction code (i.e., the second error correction code unit) of the data unit. In some embodiments, error correction module 125 determines the number of data bit errors in the data unit based on the combination of the first error correction code and the second error correction code. In these embodiments, the error correction module 125 adds (e.g., appends) the redundancy bits of the first error correction code to the second error correction code. If the number of data bit errors in the data unit does not exceed the error correction capacity of the second error correction code for the data unit, the method 800 proceeds to step 860. Otherwise, the method 800 proceeds to step 865.

In step 860, arrived at from the determination in step 855 that the number of data bit errors in the data unit does not exceed the error correction capacity of the second error correction code for the data unit, data bit errors are corrected in the data unit. In various embodiments, the error correction module 125 corrects the number of data bit errors in the data unit based on the second error correction code of the data unit. For example, the error correction module 125 may correct the number of data bit errors in the data unit by using the second error correction code of the data unit. In some embodiments, the error correction module 125 corrects the number of data bit errors in the data unit based on a combination of the first error correction code and the second error correction code. The method 800 then ends.

In step 865, arrived at from the determination in step 855 that the number of data bit errors in the data unit exceeds the error correction capacity of the second error correction code for the data unit, a RAID operation is performed to recover the data unit. In various embodiments, the data storage controller 110 recovers the data unit by performing a RAID operation. For example, the data recovery module 140 may recover the data unit by performing a RAID operation using a parity unit associated with the data unit. The method 800 then ends.

In various embodiments, the method 800 illustrated in FIG. 8 may include more or fewer than the steps 805-865 illustrated in FIG. 8 and described above. In some embodiments, the steps 805-865 of the method 800 illustrated in FIG. 8 may be performed in a different order than the order illustrated in FIG. 8 and described above. In some embodiments, some of the steps 805-865 of the method 800 illustrated in FIG. 8 may be performed in parallel or substantially simultaneously. In various embodiments, one or more of the steps 805-865 may be performed more than once in the method 800 illustrated in FIG. 8.

Figure 9:
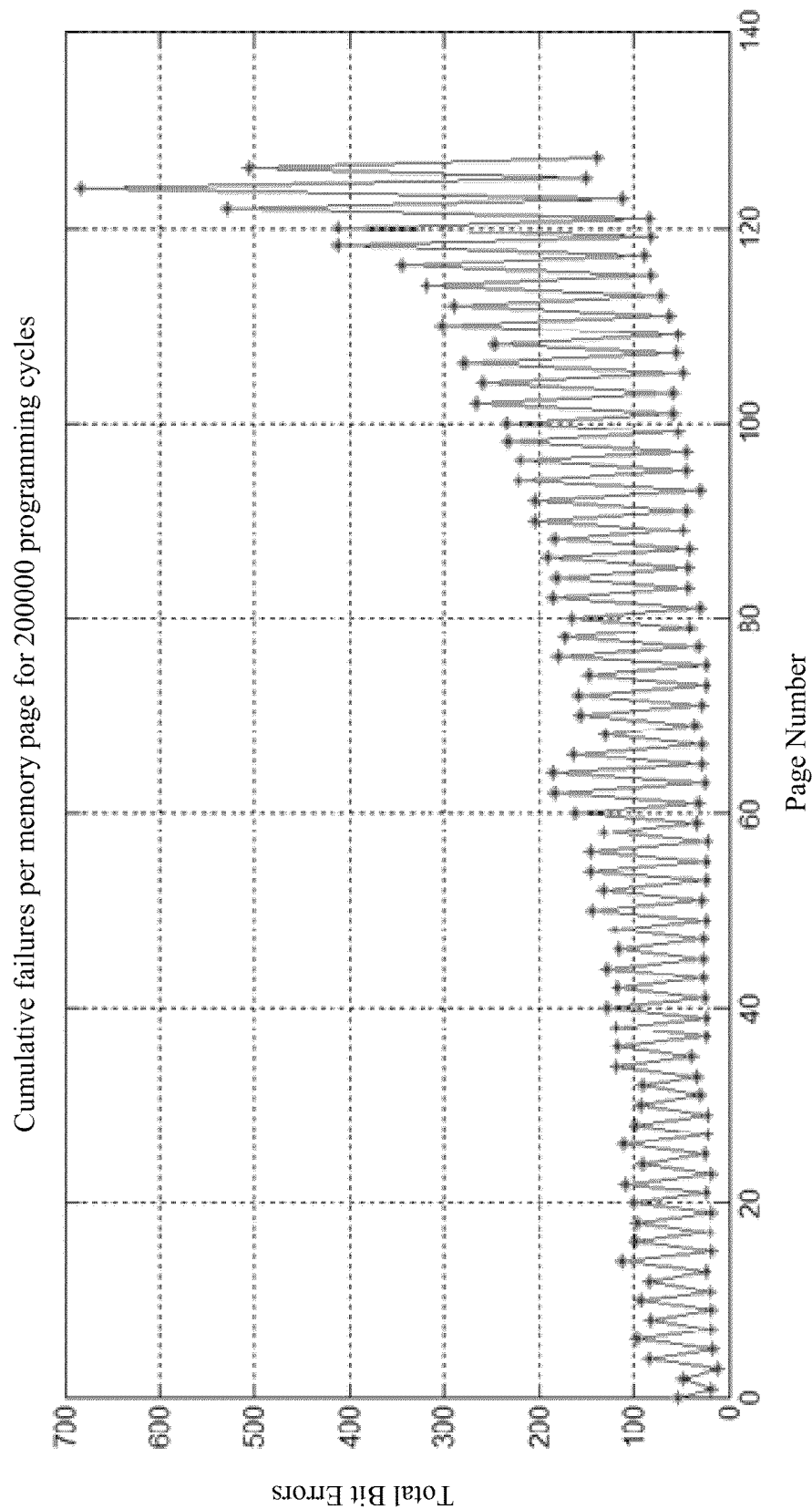
FIG. 9 is a graph of cumulative data bit errors as a function of page number for an exemplary data storage module, in accordance with an embodiment of the present invention.

FIG. 9 is a graph 900 illustrating cumulative bit errors as a function of page number for an exemplary data storage module 115, in accordance with an embodiment of the present invention. In this embodiment, the data storage module 115 is a NAND flash storage. The graph 900 indicates cumulative bit errors (i.e., failures) measured for memory pages 200 in a storage block 130 of the data storage module 115 (i.e., NAND flash storage) as a function of page number of those memory pages 200. As illustrated in FIG. 9, the cumulative number of bit errors has a positive correlation with the page number of memory pages 200 of the data storage module 115. In this embodiment, the bit-error rate for a memory pages 200 in the storage block 130 of the data storage module 115 is determined by dividing the cumulative number of bit errors measured for the memory page 200 during a fixed number of program-erase cycles and a fixed number of read operations performed on the memory page 200 by the number of bits in the memory page 200.

As illustrated in the graph 900, the number of times each of the memory pages 200 of the data storage module 115 is programmed (pecyc) is 200,000. As also illustrated in the graph 900, the number of cumulative bit-errors for the memory page 200 having page number 6 is approximately 100 and the cumulative number of bit-errors for memory page 200 having page number 124 is approximately 680. As may be envisioned from the graph 900, the bit-error rates for the memory pages 200 have a positive correlation with the page number of the memory pages 200. In this way, the bit-error rates of the memory pages 200 generally increase as the page numbers of the memory pages 200 increase.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system comprising:
   a data storage module comprising a first storage block and a second storage block, the first storage block comprising a first memory page, the second storage block comprising a first memory page; and
   a data storage controller coupled to the data storage module, the data storage controller further comprising an error correction module configured to generate a first error correction code unit for a first data unit, the first error correction code unit having an error correction capacity and a second error correction code unit for the first data unit, the second error correction code unit having an error correction capacity, wherein the error correction capacity of the first error correction code unit is distinct from the error correction capacity of the second error correction code unit, the data storage controller configured to store the first data unit into the first memory page of the first storage block, store the first error correction code unit for the first data unit into the first memory page of the first storage block, and store the second error correction code unit for the first data unit into the first memory page of the second storage block, wherein the first memory page of the first storage block does not have a storage capacity sufficient for storing the first data unit, the first error correction code unit for the first data unit and the second error correction code unit for the first data unit.

2. The system of claim 1, wherein the first error correction code unit for the first data unit in combination with the second error correction code unit for the first data unit form an error correction code for the first data unit.

3. The system of claim 1, wherein the first storage block comprises a second memory page, and wherein the data storage controller is further configured to store a second data unit into the second memory page of the first storage block, store a first error correction code unit for the second data unit into the second memory page of the first storage block, and store a second error correction code unit for the second data unit into the first memory page of the second storage block.

4. The system of claim 1, wherein the data storage module further comprises a third storage block comprising a first memory page, and wherein the data storage controller is further configured to store a second data unit into the first memory page of the third storage block, store a first error correction code unit for the second data unit into the first memory page of the third storage block, and store a second error correction code unit for the second data unit into the first memory page of the second storage block.

5. The system of claim 1, wherein the first error correction code unit for the first data unit is a first error correction code for correcting up to a first number of data bit errors in the first data unit, the second error correction code unit for the first data unit is a second error correction code for correcting up to a second number of data bit errors in the first data unit, and the second number of data bit errors is greater than a first number of data bit errors.

6. The system of claim 1, wherein the first error correction code unit for the first data unit is a first error correction code for correcting up to a first number of data bit errors in the first data unit, the second error correction code unit for the first data unit is a second error correction code for correcting up to a second number of data bit errors minus the first number of data bit errors in the first data unit, and the first error correction code in combination with the second error correction code form an error correction code for correcting up to the second number of data bit errors in the first data unit.

7. The system of claim 1, wherein the data storage controller is further configured to determine whether the first data unit has a number of data bit errors exceeding the error correction capacity of the first error correction code unit, correct the number of data bit errors in the first data unit by using the first error correction code unit if the number of data bit errors in the first data unit does not exceed the error correction capacity of the first error correction code unit, and correct the number of data bit errors in the first data unit by using the second error correction code unit if the number of data bit errors in the first data unit exceeds the error correction capacity of the first error correction code unit but does not exceed the error correction capacity of the second error correction code unit.

8. The system of claim 7, wherein the data storage controller is further configured to perform a redundant array of inexpensive disks (RAID) operation to recover the first data unit if the number of data bit errors in the first data unit exceeds the error correction capacity of the second error correction code unit.

9. A system comprising:
a data storage module comprising a plurality of storage blocks, each storage block of the plurality of storage blocks comprising a plurality of memory pages, each of the plurality of memory pages having a corresponding bit-error rate, the plurality of memory pages including a first plurality of memory pages having a lower bit-error rate and a second plurality of memory pages having a higher bit-error rate; and
a data storage controller coupled to the data storage module, the data storage controller further comprising an error correction module configured to generate a first error correction code having an error correction capacity for a first data unit and to generate a second error correction code having an error correction capacity for a second data unit, wherein the error correction capacity of the first error correction code is lower than the error correction capacity of the second error correction code, the data storage controller configured to store the first data unit and the first error correction code into the plurality of memory pages having a lower bit-error rate and configured to store the second data unit and the second error correction code into the plurality of memory pages having a higher bit-error rate.

10. The system of claim 9, wherein the data storage controller is further configured to simultaneously read the first data unit and the first error correction code from the data storage block, determine whether the first data unit has a number of data bit errors exceeding the error correction capacity of the first error correction code, correct the number of data bit errors in the first data unit by using the first error correction code if the number of data bit errors in the first data unit does not exceed the error correction capacity of the first error correction code, read a second error correction code for the first data unit from the error correction code storage block if the number of data bit errors in the first data unit exceeds the error correction capacity of the first error correction code, determine whether the first data unit has a number of data bit errors exceeding an error correction capacity of the second error correction code, and correct the number of data bit errors in the first data unit by using the second error correction code if the number of data bit errors in the first data unit exceeds the error correction capacity of the first error correction code but does not exceed the error correction capacity of the second error correction code.

11. The system of claim 10, further comprising a data recovery module configured to perform a redundant array of inexpensive disks (RAID) operation to recover the first data unit if the number of data bit errors in the first data unit exceeds the error correction capacity of the second error correction code.

12. A method comprising:
generating a first error correction code unit for a first data unit, the first error correction code unit having an error correction capacity;
generating a second error correction code unit for the first data unit, the second error correction code having an error correction capacity, wherein the error correction capacity of the second error correction code unit is distinct from the error correction capacity of the first error correction code unit;

storing the first data unit into a first memory page of a first storage block of a data storage device;

storing the first error correction code unit for the first data unit into the first memory page of the first storage block, wherein the storage capacity of the first memory page of the first storage block is not sufficient for storing the first data unit, the first error correction code unit for the first data unit and the second error correction code unit for the first data unit;

storing the second error correction code unit for the first data unit into a first memory page of a second storage block of the data storage device;

determining a number of data bit errors in the first data unit; and correcting the number of data bit errors in the first data unit based on the first error correction code unit and the second error correction code unit.

13. The method of claim 12, wherein the first error correction code unit for the first data unit in combination with the second error correction code unit for the first data unit form an error correction code for the first data unit.

14. The method of claim 12, wherein the first storage block comprises a second memory page, the method further comprising storing a second data unit into the second memory page of the first storage block, storing a first error correction code unit for the second data unit into the second memory page of the first storage block, and storing a second error correction code unit for the second data unit into the first memory page of the second storage block.

15. The method of claim 14, wherein the first memory page of the first storage block has a different memory page number than the first memory page of the second storage block.

16. The method of claim 15, wherein a bit-error rate of the first memory page of the first storage block is higher than a bit-error rate of the first memory page of the second storage block.

17. The method of claim 12, wherein the data storage module further comprises a third storage block comprising a first memory page, the method further comprising storing a second data unit into the first memory page of the third storage block, storing a first error correction code unit for the second data unit into the first memory page of the third storage block, and storing a second error correction code unit for the second data unit into the first memory page of the second storage block.

18. The method of claim 12, wherein the first error correction code unit for the first data unit is a first error correction code for correcting up to a first number of data bit errors in the first data unit, the second error correction code unit for the first data unit is a second error correction code for correcting up to a second number of data bit errors minus the first number of data bit errors in the first data unit, and second number of data bit error is greater than the first number of data bit errors.

19. The method of claim 18, further comprising:
determining whether the first data unit has a number of data bit errors exceeding an error correction capacity of the first error correction code; and
correcting the number of data bit errors in the first data unit based on the first error correction code for the first data unit if the number of data bit errors in the first data unit does not exceed the error correction capacity of the first error correction code.

20. The method of claim 18, further comprising:
determining whether the first data unit has a number of data bit errors exceeding an error correction capacity of the second error correction code; and correcting the number of data bit errors in the first data unit by using the second error correction code if the number of data bit errors exceeds the error correction capacity of the first error correction code but does not exceed the error correction capacity of the second error correction code.

21. The method of claim 20, further comprising performing a redundant array of inexpensive disks (RAID) operation to recover the first data unit if the number of data bit errors in the first data unit exceeds the error correction capacity of the second error correction code.

22. A flash storage system comprising:
a data storage module comprising a plurality of storage blocks, each storage block of the plurality of storage blocks comprising a plurality of memory pages; and
a data storage controller coupled to the data storage module, the data storage controller further comprising an error correction module configured to generate a first error correction code unit for a data unit, the first error correction code unit having an error correction capacity and a second error correction code unit for the data unit, the second error correction code unit having an error correction capacity, wherein the error correction capacity of the first error correction code unit is distinct from the error correction capacity of the second error correction code unit, the data storage controller configured to store the data unit into a first memory page of a first one of the plurality of storage blocks, store the first error correction code unit for the data unit into the first memory page of the first one of the plurality of storage blocks, and store a second error correction code unit for the data unit into a first memory page of a second one of the plurality of storage blocks, wherein the first memory page of the first one of the plurality of storage blocks does not have a storage capacity sufficient for storing the data unit, the first error correction code unit for the data unit and the second error correction code unit for the data unit.

23. The flash storage system of claim 22, wherein the first error correction code unit for the data unit in combination with the second error correction code unit for the data unit form an error correction code for the data unit.

24. The flash storage system of claim 22, wherein the first error correction code unit for the data unit is a first error correction code for correcting up to a first number of data bit errors in the data unit, the second error correction code unit for the data unit is a second error correction code for correcting up to a second number of data bit errors in the data unit, and the second number of data bit errors is greater than a first number of data bit errors.

25. The flash storage system of claim 22, wherein the first error correction code unit for the data unit is a first error correction code for correcting up to a first number of data bit errors in the data unit, the second error correction code unit for the data unit is a second error correction code for correcting up to a second number of data bit errors minus the first number of data bit errors data bit errors in the data unit, and the first error correction code in combination with the second error correction code form an error correction code for correcting up to the second number of data bit errors in the data unit.

26. The flash storage system of claim 22, wherein the data storage controller is further configured to determine whether the data unit has a number of data bit errors exceeding the error correction capacity of the first error correction code unit, correct the number of data bit errors in the data unit by using the first error correction code unit if the number of data bit errors in the data unit does not exceed the error correction capacity of the first error correction code unit, and correct the number of data bit errors in the data unit by using the second error correction code unit if the number of data bit errors in the data unit exceeds the error correction capacity of the first error correction code unit but does not exceed the error correction capacity of the second error correction code unit.

27. The flash storage system of claim 22, wherein the data storage controller is further configured to perform a redundant array of inexpensive disks (RAID) operation to recover the data unit if the number of data bit errors in the data unit exceeds the error correction capacity of the second error correction code unit.

\* \* \* \* \*